US009364086B2

(12) United States Patent
Takahara et al.

(10) Patent No.: US 9,364,086 B2
(45) Date of Patent: Jun. 14, 2016

(54) ARTICLE STORAGE FACILITY AND ARTICLE STORAGE METHOD

(71) Applicant: Daifuku Co., Ltd., Osaka-shi (JP)

(72) Inventors: Masahiro Takahara, Gamo-gun (JP); Toshihito Ueda, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 249 days.

(21) Appl. No.: 14/310,282

(22) Filed: Jun. 20, 2014

(65) Prior Publication Data

US 2015/0003942 A1 Jan. 1, 2015

(30) Foreign Application Priority Data

Jun. 26, 2013 (JP) .................................. 2013-134266

(51) Int. Cl.
*H01L 21/677* (2006.01)
*A47B 81/00* (2006.01)
*H01L 21/673* (2006.01)

(52) U.S. Cl.
CPC .......... *A47B 81/00* (2013.01); *H01L 21/67379* (2013.01); *H01L 21/67393* (2013.01); *H01L 21/67733* (2013.01); *H01L 21/67769* (2013.01)

(58) Field of Classification Search
CPC .............. A27B 81/00; H01L 21/67733; H01L 21/67769; H01L 21/67393; H01L 21/67379
USPC ........... 141/5, 8, 65–66, 94, 98; 414/935, 940
See application file for complete search history.

(56) References Cited

U.S. PATENT DOCUMENTS

| 5,879,458 A | * | 3/1999 | Roberson, Jr. ..... H01L 21/67017 118/715 |
| 6,042,651 A | * | 3/2000 | Roberson, Jr. ..... H01L 21/67017 118/715 |
| 6,221,163 B1 | * | 4/2001 | Roberson, Jr. ..... H01L 21/67017 118/715 |
| 6,368,411 B2 | * | 4/2002 | Roberson, Jr. ..... H01L 21/67017 118/715 |
| 6,418,979 B1 | * | 7/2002 | Lewis ............... H01L 21/67379 141/4 |
| 6,439,822 B1 | * | 8/2002 | Kimura ............ H01L 21/67769 118/719 |
| 6,746,197 B2 | * | 6/2004 | Kimura ............ H01L 21/67769 414/217 |

(Continued)

FOREIGN PATENT DOCUMENTS

JP 5869604 A 4/1983
JP 873010 A 3/1996

(Continued)

*Primary Examiner* — Nicolas A Arnett
(74) *Attorney, Agent, or Firm* — The Webb Law Firm

(57) ABSTRACT

Proper article storage management is made possible in the article storage facility which stores articles in containers and in an inactive gas environment. The article storage facility includes a storage rack having storage sections, a transport portion which transports containers to the storage sections, gas supplying portions each of which supplies inactive gas to the container stored in the storage section, and a display. The display displays display sections such that the arrangement of the display sections corresponds to the arrangement of the storage sections in the storage rack and displays a supply state of inactive gas in each of the display sections.

14 Claims, 11 Drawing Sheets

(56) References Cited

U.S. PATENT DOCUMENTS

| | | | | |
|---|---|---|---|---|
| 6,901,971 | B2* | 6/2005 | Speasl | G03F 7/7075 |
| | | | | 141/1 |
| 7,490,637 | B2* | 2/2009 | Speasl | G03F 7/7075 |
| | | | | 141/11 |
| 7,918,122 | B2* | 4/2011 | Murata | G01D 21/00 |
| | | | | 73/1.16 |
| 9,257,320 | B2* | 2/2016 | Fosnight | H01L 21/67775 |
| 2001/0042439 | A1* | 11/2001 | Roberson, Jr. | H01L 21/67017 |
| | | | | 95/8 |
| 2002/0182040 | A1* | 12/2002 | Kimura | H01L 21/67769 |
| | | | | 414/331.04 |
| 2007/0144118 | A1* | 6/2007 | Alvarez | H01L 21/67017 |
| | | | | 55/385.1 |
| 2008/0030341 | A1* | 2/2008 | Zhuang | H01L 21/67294 |
| | | | | 340/572.7 |
| 2008/0156069 | A1* | 7/2008 | Murata | G01D 21/00 |
| | | | | 73/19.04 |
| 2009/0272461 | A1* | 11/2009 | Alvarez, Jr. | H01L 21/67017 |
| | | | | 141/64 |

FOREIGN PATENT DOCUMENTS

| | | |
|---|---|---|
| JP | 200337148 A | 2/2003 |
| JP | 2006188322 A | 7/2006 |
| JP | 2010159570 A | 7/2010 |
| JP | 2010182747 A | 8/2010 |
| JP | 2012222341 A | 11/2012 |

* cited by examiner

| Os | Represented items |
|---|---|
| ☐ | No load |
| ▨ | Purge stopped |
| ▨ | First phase (initial phase) |
| ▨ | First phase (additional phase) |
| ▨ | Second phase (maintenance phase) |
| ▨ | Third phase (pause phase) |
| ▨ | Fifth supply pattern (cleaning nozzle) |
| ▨ | Sixth supply pattern (cleaning piping) |
| ▨ | Warning condition |
| ▨ | Abnormal condition |

Fig.10

ARTICLE STORAGE FACILITY AND ARTICLE STORAGE METHOD

CROSS-REFERENCE TO RELATED APPLICATION

This application claims priority to Japanese Patent Application No. 2013-134266 filed Jun. 26, 2013, the disclosure of which is hereby incorporated in its entirety by reference.

FIELD OF THE INVENTION

The present invention relates to an article storage facility, and to an article storage method, for storing articles.

BACKGROUND

An example of such an article storage facility for storing articles is disclosed in JP Publication of Application No. H08-73010 (Patent Document 1). The device of Patent Document 1 is a device for a transport system to be utilized in an automated warehouse. Movement of the articles (including carrying in operations and carrying out operations) is controlled by such a device based on instructions from the user. In the device of Patent Document 1, the layout of a storage rack is displayed on the CRT display of a workstation assigned for control purposes. And when an article is actually stored in the storage rack, an article object (i.e., an image object representing the article) is displayed at the corresponding position of the storage rack on the screen. And the system is set up so that the user specifies, on the CRT display, the destination for an article by operating the mouse. This is an attempt to simplify the operation for specifying the destination for an article by adapting a method for inputting instructions, that can be easily understood intuitively.

SUMMARY OF THE INVENTION

However, in the device of Patent Document 1, the only image objects that are displayed with the layout of the storage rack are the article objects. Therefore, when this arrangement is adapted to a specific article storage facility (for example, a facility in which articles are stored in airtight containers and in an inactive gas environment), the user cannot necessarily perform operations to specify destinations only with the technology disclosed in Patent Document 1. More specifically, with the arrangement of Patent Document 1, only the information as to whether an article is present in a given position of the actual storage rack is displayed on the CRT display; thus, for example, a take out command may be issued with relatively high concentration of oxygen, or water vapor, etc., still remaining in the container storing the articles.

Accordingly, a technology that would allow proper article management is desired for a facility in which articles are stored in airtight containers and in an inactive gas environment.

An article storage facility in accordance with the present invention comprises:

a storage rack having a plurality of storage sections arranged with regularity;

a transport portion which carries in airtight containers to the storage sections and carries out the airtight containers from the storage sections;

gas supplying portions which supply inactive gas to respective ones of the containers stored in the storage sections, in accordance with a supply pattern defined in advance;

a display which displays an operation state of a system of the article storage facility, the operation state including an operation state of the transport portion and operation states of the gas supplying portions;

wherein the display displays a plurality of display sections such that an arrangement of the display sections corresponds to an arrangement of the plurality of the storage sections in the storage rack, and also displays, in each of the plurality of display sections, a supply state of the inactive gas to the container stored in a corresponding one of the storage sections.

With the arrangement described above, inactive gas is supplied to each of the containers stored in the storage sections of the storage rack from the corresponding one of the gas supplying portions. Therefore, the articles stored in a container can be stored in an inactive gas environment. During this time, the supply state of inactive gas for each of the containers stored in the storage sections is also displayed on the display which displays the operation state of the entire system. Therefore, the user can be provided with information about whether inactive gas is properly supplied to the interior of the containers. This arrangement helps reduce the number of incidents where taking out instructions of articles are made with relatively high concentration of gas, that is undesirable for the storage of articles, still remaining within the container; thus, proper article management is made possible. In addition, with the arrangement described above, the supply state of inactive gas for each container is displayed in each of the plurality of display sections which are arranged to correspond to the arrangement of the plurality of storage sections in the storage rack. This arrangement makes it easy to intuitively grasp the supply state of the inactive gas for each container stored in each position of the actual storage rack. Therefore, the proper article management is made possible in a manner that is easy to conduct for the user.

The technical features of the article storage facility in accordance with the present invention also apply to an article storage method; and such method falls within the scope of protection of the present invention. Such article storage method also provides the functions and effects associated with the article storage facility as described above. More specifically, an article storage method in accordance with the present invention is a method utilizing an article storage facility having a storage rack having a plurality of storage sections arranged with regularity, a transport portion which carries in airtight containers to the storage sections and carries out the airtight containers from the storage sections, gas supplying portions which supply inactive gas to respective ones of the containers stored in the storage sections, in accordance with a supply pattern defined in advance, a display which displays an operation state of a system of the article storage facility, the operation state including an operation state of the transport portion and operation states of the gas supplying portions, the article storage method includes the following step that is performed by the display:

a supply state displaying step of displaying a plurality of display sections such that an arrangement of the display sections corresponds to an arrangement of the plurality of the storage sections in the storage rack, and also displaying, in each of the plurality of display sections, a supply state of the inactive gas to the container stored in a corresponding one of the storage sections.

Modes of preferred embodiments of the present invention are described next.

In an embodiment of the article storage facility in accordance with the present invention, the display preferably displays, as a kind of the gas supply state, purge progress which represents a proportion of the amount of the inactive gas that has been supplied to the container with respect to an internal volume of the container.

The proportion of the amount of the supplied inactive gas with respect to the internal volume of the container that can be calculated quantitatively in the system is roughly equal to the proportion of the gas contained in the container that has been replaced by the newly supplied inactive gas. With the arrangement described above, it is easy to intuitively grasp the proportion (purge proportion) of the gas contained in the container that was actually replaced by the inactive gas. This allows the user to easily perceive a rough estimate of the remaining time to the completion of the purging process by means of the inactive gas.

In an embodiment of the article storage facility in accordance with the present invention, when the container is carried into the storage section by the transport portion, the display preferably displays the purge progress for the container.

When a container has just been carried into a storage section, a relatively high concentration of gas other than the inactive gas is likely to be contained in the container compared to the concentration at any subsequent time. For this reason, the initial supplying of the inactive gas of the amount equal to the internal volume of the container, performed first after the container is carried into the storage section, is very important. To this end, the arrangement described above allows the user to easily perceive a rough estimate of the remaining time to the completion of the purging process during the initial supplying of inactive gas which is of great importance.

In an embodiment of the article storage facility in accordance with the present invention, the supply pattern preferably includes a plurality of supply phases that are defined such that a combination of a supplying timing of the inactive gas and a target flow rate is different for a different supply phase, wherein the display preferably indicates, as a kind of the supply state, which one of the supply phases the container is subjected to at the time by means of different colors depending on the supply phase.

The arrangement described above can allow the user to easily perceive the supply phase that the container stored in each storage section is subjected to, by means of the corresponding color.

In an embodiment of the article storage facility in accordance with the present invention, the gas supplying portion is preferably configured to be able to supply the inactive gas to clean a gas supply nozzle which fits into a gas supply opening provided to the container, in a predetermined period before the container is carried into the storage section by the transport portion, wherein the display preferably indicates, as a kind of the supply state, the fact that the inactive gas is being supplied to clean the gas supply nozzle by means of a color that is different from the colors representing respective ones of the plurality of supply phases.

This arrangement allows the user to easily perceive that the inactive gas is being supplied to clean the gas supply nozzle by means of a corresponding color. Also, the user can easily perceive that the cleaning of the gas supply nozzle has been completed with a change of the color.

In an embodiment of the article storage facility in accordance with the present invention, the article storage facility preferably further includes a load presence period acquiring portion which acquires a load presence period which is an elapsed time after the container is carried into the storage section, wherein, if the load presence period for a given container exceeds a standard load presence period defined in advance, the display preferably further displays warning information indicating that the standard load presence period has been exceeded, in the display section corresponding to the storage section in which the container is stored.

When there are any containers for which the load presence period exceeds the standard load presence period, the above arrangement allows the user to easily perceive this fact. Thus, for example, even when the stored articles have a tendency to degrade with the passage of time even in an inactive gas environment, it is possible to reduce the progress of the degradation of the stored articles due to their being left in the storage rack for a long period of time.

In an embodiment of the article storage facility in accordance with the present invention, the article storage facility preferably further includes an identifying information acquiring portion which acquires identifying information of the containers stored in the storage sections, wherein, if the identifying information acquiring portion is unable to acquire identifying information for a given container, the display preferably further displays warning information indicating that the identifying information is not acquired, in the display section corresponding to the storage section in which the container is stored.

When there are any containers for which the unique identifying information is not acquired, the arrangement described above allows the user to easily perceive this fact. Therefore, for example, any hardware failure of the apparatus for reading the identifying information of the containers can be discovered at an early stage. In addition, for example, when the supply history of the inactive gas for the container is managed based on the unique identifying information, the arrangement can reduce the number of incidents where the container is taken out without proper history management.

In an embodiment of the article storage method in accordance with the present invention, in the supply state displaying step, as a kind of the gas supply state, purge progress is preferably displayed, the purge progress representing a proportion of the amount of the inactive gas that has been supplied to the container with respect to an internal volume of the container.

In an embodiment of the article storage method in accordance with the present invention, in the supply state displaying step, when the container is carried into the storage section by the transport portion, the purge progress for the container is preferably displayed.

In an embodiment of the article storage method in accordance with the present invention, the supply pattern preferably includes a plurality of supply phases that are defined such that a combination of a supplying timing of the inactive gas and a target flow rate is different for a different supply phase, wherein, in the supply state displaying step, the supply phase that the container is subjected to at the time is preferably indicated, as a kind of the supply state, by means of different colors depending on the supply phase.

In an embodiment of the article storage method in accordance with the present invention, the gas supplying portion is preferably configured to be able to supply the inactive gas to clean a gas supply nozzle which fits into a gas supply opening provided to the container, in a predetermined period before the container is carried into the storage section by the transport portion, wherein, in the supply state displaying step, the fact that the inactive gas is being supplied to clean the gas supply nozzle is preferably indicated, as a kind of the supply state, by means of a color that is different from the colors representing respective ones of the plurality of supply phases.

In an embodiment of the article storage method in accordance with the present invention, the article storage facility further includes a load presence period acquiring portion which acquires a load presence period which is an elapsed time after the container is carried into the storage section, wherein the steps performed by the display preferably further includes a step of further displaying warning information indicating that a standard load presence period has been exceeded, in the display section corresponding to the storage section in which the container is stored, if the load presence period for a given container exceeds the standard load presence period defined in advance.

In an embodiment of the article storage method in accordance with the present invention, the article storage facility further includes an identifying information acquiring portion which acquires identifying information of the containers stored in the storage sections, wherein the steps performed by the display preferably further includes a step of further displaying warning information indicating that the identifying information is not acquired, in the display section corresponding to the storage section in which the container is stored, if the identifying information acquiring portion is unable to acquire identifying information for a given container.

BRIEF DESCRIPTION OF THE DRAWINGS

FIG. 10 is a diagram showing the images displayed on the display.

DETAILED DESCRIPTION

1. First Embodiment

The first embodiment of an article storage facility in accordance with the present invention is described next with reference to the drawings. In the present embodiment, an example is described in which an article storage facility 1 is configured to store the articles that are housed or stored in containers 40 and in an inactive gas environment. Such an article storage facility 1 can be installed and utilized, for example, in a clean room.

Figure 1:
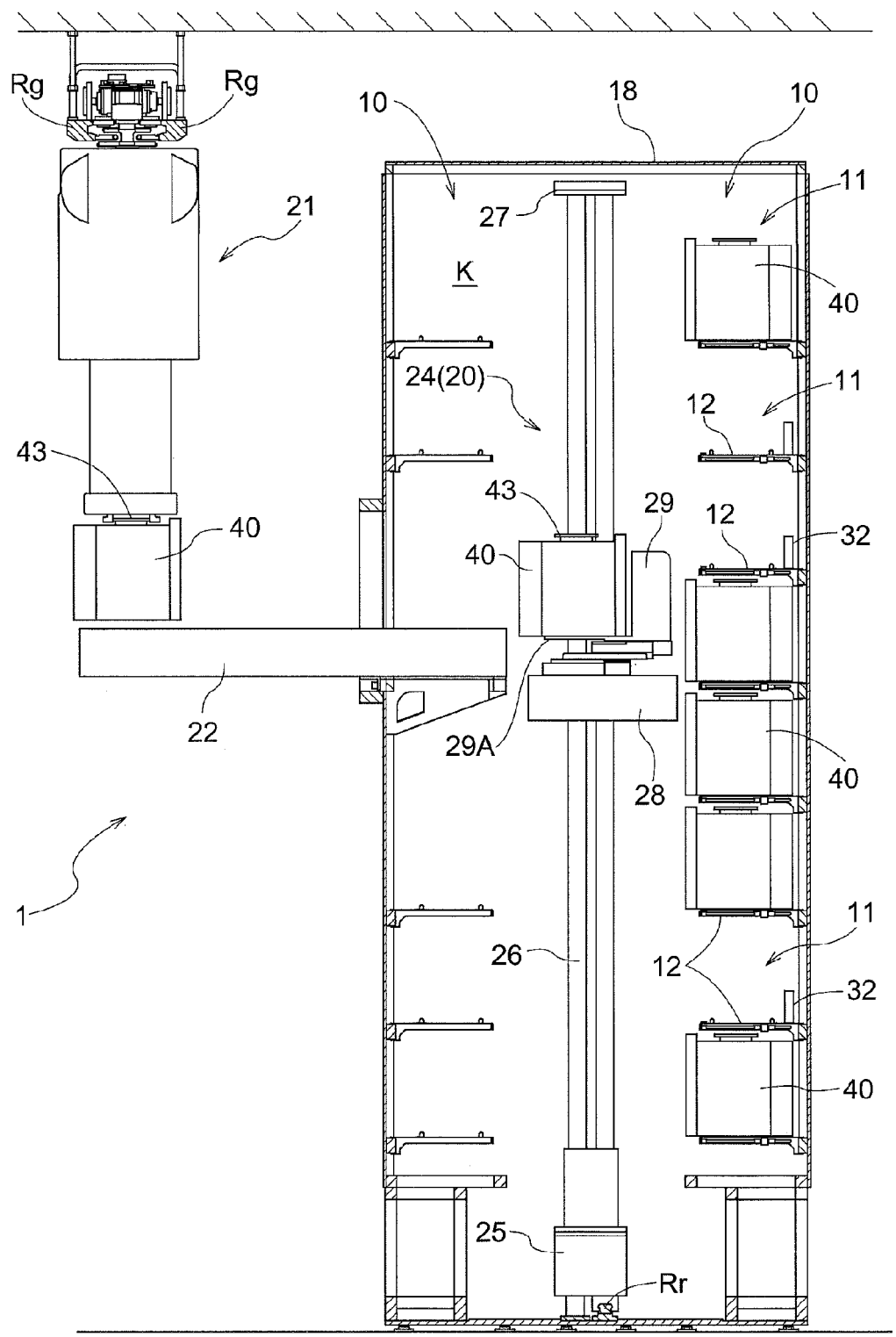
FIG. 1 is a side view of an article storage facility.
Figure 2:
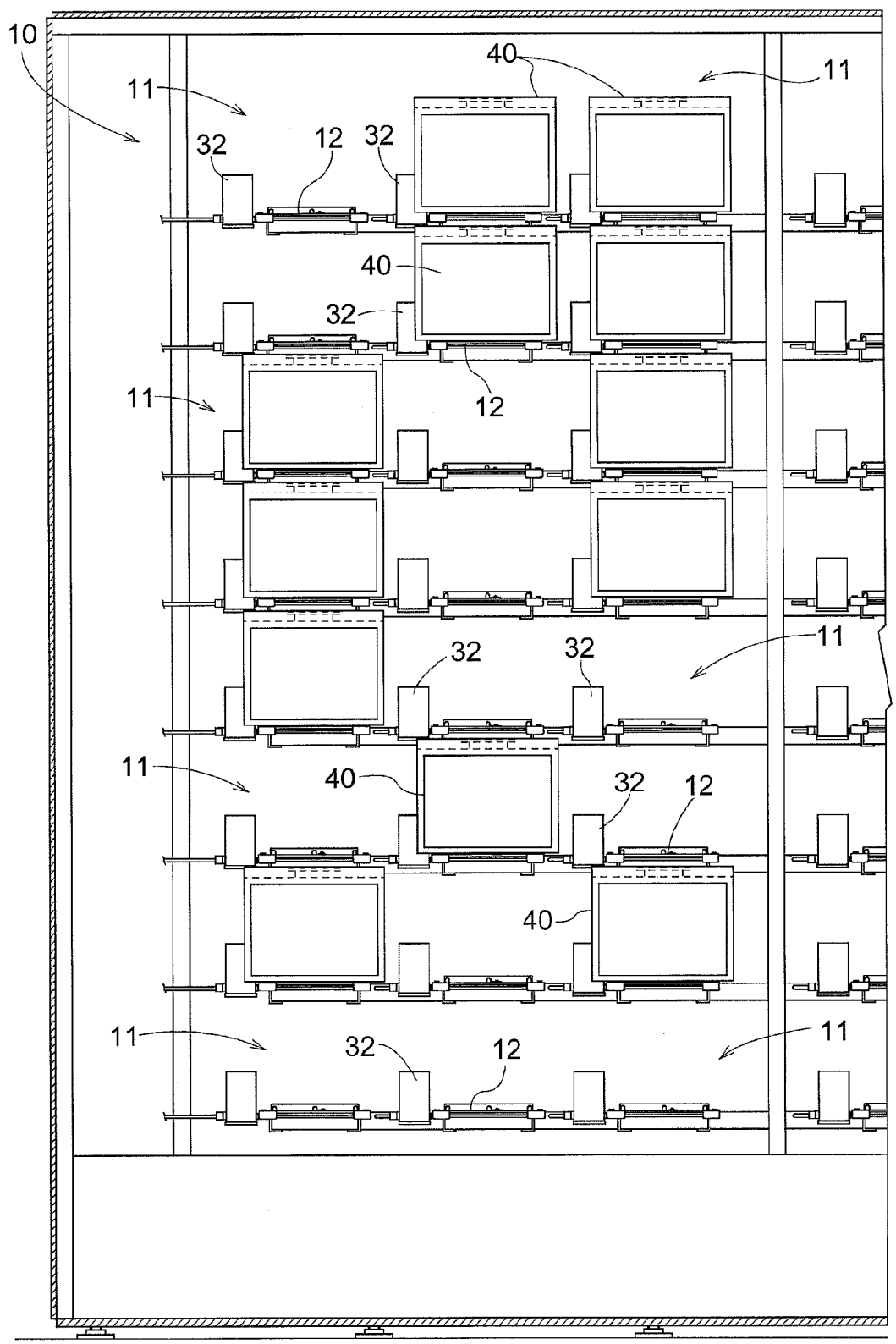
FIG. 2 is a front view of the article storage facility.
Figure 4:
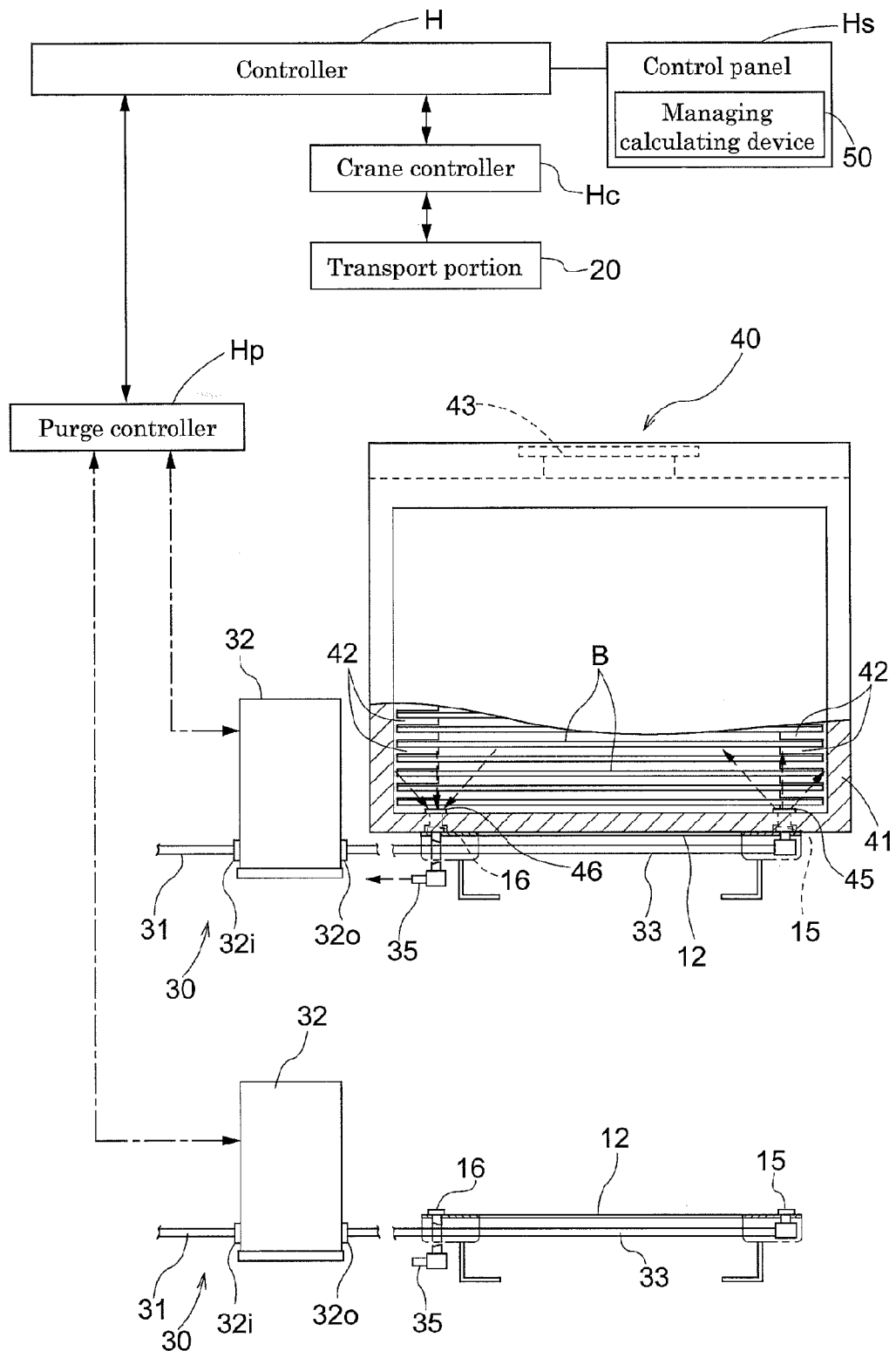
FIG. 4 is a diagram showing how inactive gas is supplied.

As shown in FIGS. 1 and 2, the article storage facility 1 includes a storage rack 10 having a plurality of storage sections 11, and a transport portion 20 which carries in containers 40 to the storage sections 11 and takes out, or carries out, the containers 40 from the storage sections 11. In addition, as shown in FIG. 4, the article storage facility 1 includes gas supplying portions 30 each of which supplies inactive gas to corresponding one of the containers 40 stored in respective storage sections 11. In addition, the article storage facility 1 includes a controller H which controls operations of the transport portion 20 and the gas supplying portions 30. In the present embodiment, the controller H is configured to control the transport portion 20 and the gas supplying portions 30 based on commands from a managing calculating device 50, such as a workstation located at a control panel Hs.

Each container 40 (container to be transported) stores, or carries articles within it when transporting the articles. The containers can be used broadly to transport articles, such as industrial commodity, food, medical supplies, etc. An example of articles for which the containers can be used includes substrates B such as semiconductor substrates which are, for example, semiconductor wafers, and reticle substrates which are, for example, glass plates with laminated thin metallic films. So called FOUPs (Front Opening Unified Pod), for example, may be used as the containers 40 for storing or carrying the substrates B (see FIG. 4). And these FOUPs can advantageously store semiconductor wafers. Such containers 40 may be airtight containers made of synthetic resin and in compliance with the SEMI (Semiconductor Equipment and Materials International) standard.

As shown in FIG. 4, the container 40 includes a casing 41 formed in a rectangular parallelepiped shape, and a lid (not shown) which can be detached and attached to this casing 41. The casing 41 has an opening in its front face for inserting and retrieving the substrates B, which opening is opened by removing the lid and is closed by attaching the lid. The container 40 is configured such that its interior space is sealed and becomes airtight when the lid is attached to the casing 41. One or more pairs of support members 42 are provided in the interior of the casing 41 with each pair supporting a substrate B at both ends in the lateral direction from below. In this embodiment, two or more sets of support members 42 are provided to each container 40 in order to accommodate a plurality of substrates B such that these sets of support members 42 are arranged, and spaced apart from each other by a set distance, in the vertical direction.

The container 40 includes, on its top surface, a top flange 43 configured to be gripped by a hoist type transport vehicle 21. The container 40 has, on its bottom surface, a plurality (three in the present example) of engaging grooves (not shown). Positioning pins 13 (see FIG. 3) provided in the support portion 12 of the storage section 11 engage with the corresponding engaging grooves. The container 40 is stored in a storage section 11 with the container 40 positioned by the engaging of the positioning pins 13 with the engaging grooves.

As shown in FIG. 4, the container 40 has, in its bottom, a gas supply opening 45 for introducing, or taking in, inactive gas supplied from the gas supplying portion 30. The gas supply opening 45 is provided with an introducing side opening and closing valve (not shown). The introducing side opening and closing valve is urged toward its closed position, or toward a valve closing side, by an urging member, such as a spring. And when the discharge pressure of the supplied inactive gas becomes greater than or equal to a set valve opening pressure which is set to be greater than the atmospheric pressure, the introducing side opening and closing valve is opened by that pressure. In addition, the container 40 has, in its bottom, a discharge opening 46 for discharging the gas that exists in its interior space. The discharge opening 46 is provided with a discharging side opening and closing valve. The discharging side opening and closing valve is urged toward its closed position, or toward a valve closing side, by an urging member, such as a spring. And when the internal pressure of the container 40 becomes greater than or equal to a set valve opening pressure which is set to be greater than the atmospheric pressure, the discharging side opening and closing valve is opened by that pressure.

As shown in FIGS. 1 and 2, the storage rack 10 has a plurality of storage sections 11 arranged next to one another with regularity. The plurality of storage sections 11 are arranged in accordance with a predetermined rule (e.g., vertically and horizontally, as in the present example). More specifically, the plurality of storage sections 11 are arranged such that storage sections 11 are next to one another in the vertical direction while at each vertical position, storage sections 11 are arranged next to one another in the lateral, or horizontal, direction. A container 40 can be stored in each of the plurality of storage sections 11. Two such storage racks 10 are provided in the present embodiment. And the two storage racks 10 which forms a pair are installed such that they face each other with a stacker crane 24, which functions as the transport portion 20, located in between. Each of the pair of storage racks 10 is called a "bank". The pair of storage racks 10 and the stacker crane 24 are located in the storage space K whose periphery is covered and defined by separating walls 18.

Figure 3:
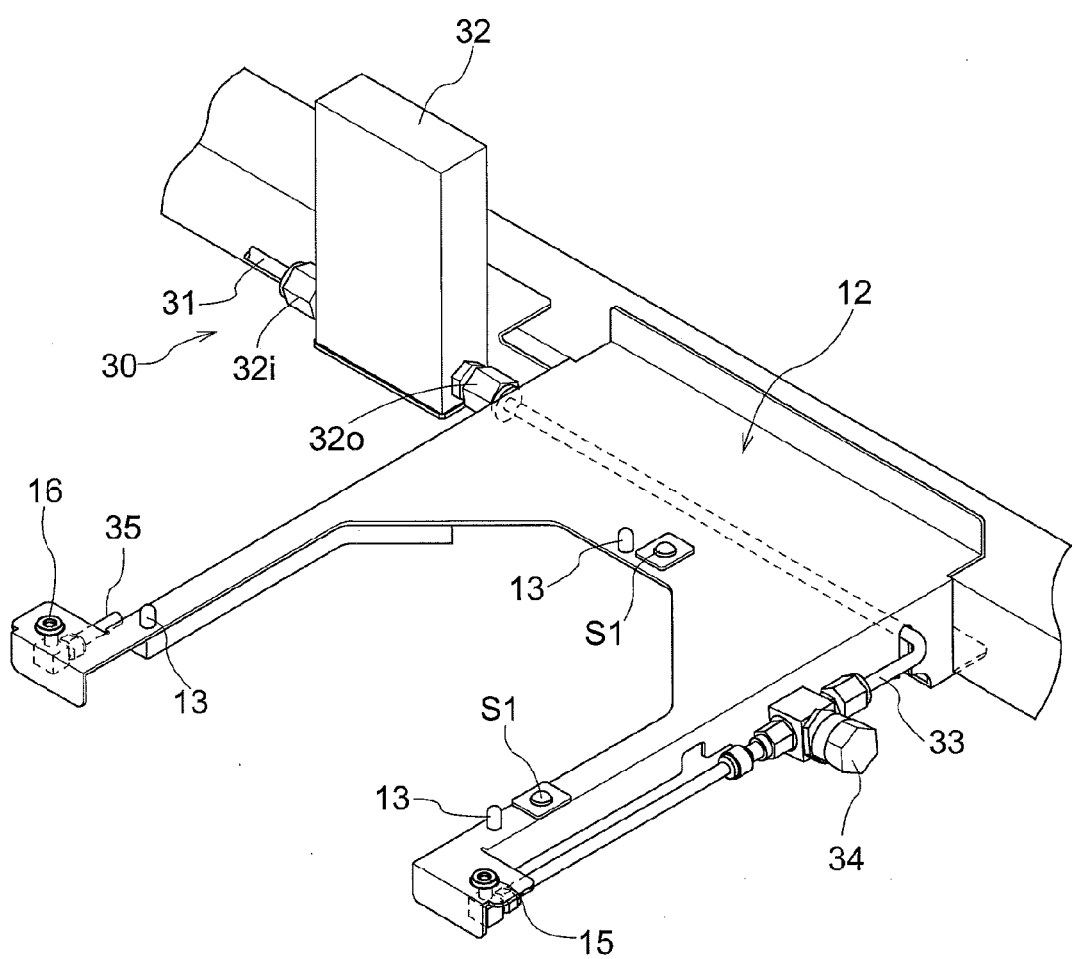
FIG. 3 is a perspective view of a storage section.

As shown in FIGS. 3 and 4, each of the plurality of storage sections 11 includes a support portion 12 which supports from below the container 40 placed on the support portion 12. Each support portion 12 is plate-shaped with its vertical dimension smaller than its dimensions in the width direction and lengthwise direction. The support portion 12 is formed to have a U-shape in plan view (i.e., as seen along the vertical direction) to define space through which a support member 29A provided to a transfer device 29 described below can pass in the vertical direction. A plurality (three in the present example) of positioning pins 13 are provided in the top surface of the support portion 12 such that they project upwardly. As described above, the container 40 is properly positioned with these positioning pins 13 engaging the engaging grooves in the bottom surface of the container 40.

A plurality (two in the present example) of first sensors S1 are provided on the top surface of the support portion 12. Each first sensor S1 may be, for example, a pressure-sensitive sensor, etc. The first sensor S1 detects whether a container 40 is placed on the support portion 12 (in other words, whether a container 40 is stored in the storage section 11). In this sense, the first sensor S1 can also be called a "load presence sensor". The information on the detection result obtained by the first sensor S1 is inputted to the controller H and the managing calculating device 50.

As shown in FIGS. 3 and 4, the support portion 12 has a gas supply nozzle 15 for supplying inactive gas supplied from the gas supplying portion 30 to the interior of the container 40. The supply pipe 33 which extends from a mass flow controller 32 described below is connected to this gas supply nozzle 15. In addition, the support portion 12 has a discharge nozzle 16 which allows the gas discharged from the interior of the container 40 to pass through. Connected to this discharge nozzle 16 is a discharge pipe 35 with an open end at its opposite end. With the container 40 placed on the support portion 12 being properly positioned, the gas supply nozzle 15 is in communication with the gas supply opening 45 of the container 40 whereas the discharge nozzle 16 is in communication with the discharge opening 46.

As shown in FIG. 1, the transport vehicle 21 is a hoist type transport vehicle in the present example. The transport vehicle 21 travels along a guide rail Rg installed to the ceiling area of the premise in which the article storage facility 1 is installed. The transport vehicle 21 is provided outside the separating walls 18 (i.e., outside the storage space K). The transport vehicle 21 carries in a container 40 to a conveyor 22 and takes out, or carries out, a container 40 from the conveyor 22 with the top flange 43 provided in the container 40 gripped. The conveyor 22 is installed such that it extends through a separating wall 18, and functions to move containers 40 between the interior of the storage space K and its exterior. That is, the conveyor 22 functions as a carry in and out section (carry in and out conveyor).

The transport portion 20 is a stacker crane 24 in the present embodiment. The stacker crane 24 includes a travel carriage 25 which can travel along the travel rail Rr, a mast 26 which stands vertically on the travel carriage 25, and a vertically movable platform 28 which can be moved vertically, or up and down, while being guided by the mast 26. The travel rail Rr is installed in the floor between the pair of storage racks 10 (between the two banks). In addition, an upper guide rail (not shown) is provided in the ceiling area of the separating walls 18 which define the storage space K, such that the upper guide rail extends parallel to the travel rail Rr. The stacker crane 24 is configured to travel, with an upper frame 27 provided in the upper end portion of the mast 26 sliding along the upper guide rail.

As shown in FIG. 1, the vertically movable platform 28 is equipped with a transfer device 29 which transfers a container 40 to or from a storage section 11. The transfer device 29 includes a plate-shaped support member 29A for supporting a container 40 from below. The support member 29A is configured to be able to be projected and retracted between a projected position at which the support member 29A is projected to within the storage section 11 and a retracted position at which the support member 29A is retracted toward the vertically movable platform 28. The stacker crane 24 with the transfer device 29 performs an unloading operation and a pick up operation to and from the storage section 11 and the conveyor 22, and thereby performs transfer operation to and from the storage section 11 and the conveyor 22. Here, the unloading operation is an operation in which a container 40 that is placed in the support member 29A is unloaded, and the pick up operation is an operation in which a container 40 is picked up and is placed on the support member 29A.

The stacker crane 24 and the transfer device 29 cooperate with each other to perform a carry in operation in which a container 40 is carried into (i.e., is stored in) a storage section 11. Also, the transfer device 29 and the stacker crane 24 cooperate with each other to perform a carry out operation in which a container 40 is carried out (i.e., is retrieved) from a storage section 11. The respective operations of the stacker crane 24 and the transfer device 29 are controlled by a crane controller Hc (see FIG. 4) so that the carry in operations and carry out operations are performed properly. Thereby, each container 40 with the substrates B stored therein is individually stored in one of the plurality of storage sections 11, and is individually retrieved from the corresponding one of the plurality of storage sections 11. In addition, the stacker crane 24 has a travel position detector which detects the travel position along the travel path, and a vertical position detector which detects the vertical position of the vertically movable platform 28. The crane controller Hc controls the operation of the stacker crane 24 based on the information on the detected results.

Each gas supplying portion 30 supplies inactive gas to the container 40 stored in the associated storage section 11. Here, inactive gas is gas with low reactivity (i.e., gas that does not cause any problematic chemical reaction) with the articles (substrates B in the present example) stored in the container 40. In the present embodiment, the gas supplying portion 30 supplies nitrogen gas which functions as the inactive gas. Rare gas, such as gaseous argon and krypton gas may be used as the inactive gas.

The gas supplying portion 30 includes an in flow pipe 31 which is connected to an inactive gas supply source (not shown) such as a gas tank, etc, a mass flow controller 32, and a supply pipe 33. Each storage section 11 of the storage rack 10 is equipped with these components (also see FIG. 2). The in flow pipe 31, the mass flow controller 32, and the supply pipe 33 for each storage section 11 define a set and are connected in series. And these sets are connected in parallel to the inactive gas supply source. Hereinafter, a description is provided focusing on piping in one of the storage sections 11. One end of the in flow pipe 31 is connected to the inactive gas supply source (not shown). The other end of the in flow pipe 31 is connected to the introducing side port 32$i$ of the mass flow controller 32. The mass flow controller 32 includes a flow rate sensor which measures the flow rate of the inactive gas that flows through its internal channel, a flow rate adjusting valve which varies and adjusts the flow rate of the inactive gas, and an internal control unit which controls the operation of the flow rate adjusting valve.

The internal control unit controls the operation of the flow rate adjusting valve in order to adjust the flow rate (in other words, the supply flow rate to the container 40) to the target flow rate V, described below, of inactive gas based on the information on the detected result from the flow rate sensor. Thus, the mass flow controller 32 plays the role of controlling the supply flow rate of the inactive gas to the container 40. One end of the supply pipe 33 is connected to the discharging side port 32$o$ of the mass flow controller 32. The other end of the supply pipe 33 is connected to the gas supply nozzle 15 provided in the support portion 12. In addition, the manually operated opening and closing valve 34 is interposed in the supply pipe 33. This opening and closing valve 34 is provided to forcibly stop the supply of inactive gas during maintenance to, for example, replace the gas supply nozzle 15.

The inactive gas which is supplied from the inactive gas supply source, and whose supply flow rate has been adjusted by the mass flow controller 32 reaches the gas supply nozzle 15 through the supply pipe 33. As described above, with the container 40 placed on the support portion 12 being properly positioned, the gas supply nozzle 15 is in communication with the gas supply opening 45 of the container 40 and the discharge nozzle 16 is in communication with the discharge opening 46. Thus, when the inactive gas of predetermined pressure is supplied from the gas supplying portion 30, the gas that has been in the container 40 is discharged to the exterior through the discharge opening 46 as the inactive gas is injected into the interior of the container 40 through the gas supply opening 45.

The gas supplying portion 30 is configured to be able to switch an inactive gas supply mode between a first mode and a second mode. The first mode (automatic supply mode) is a mode in which inactive gas is supplied in accordance with a supply pattern P (see FIG. 5) defined in advance. The second mode (manual supply mode) is a mode in which inactive gas is supplied based on a manual operation regardless of the supply pattern P. Either one of these modes can be selected for each of the plurality of storage sections 11 (i.e, for each of the plurality of containers 40 stored in the storage sections 11) based on instructions from the user (operator) of the article storage facility 1.

Figure 5:
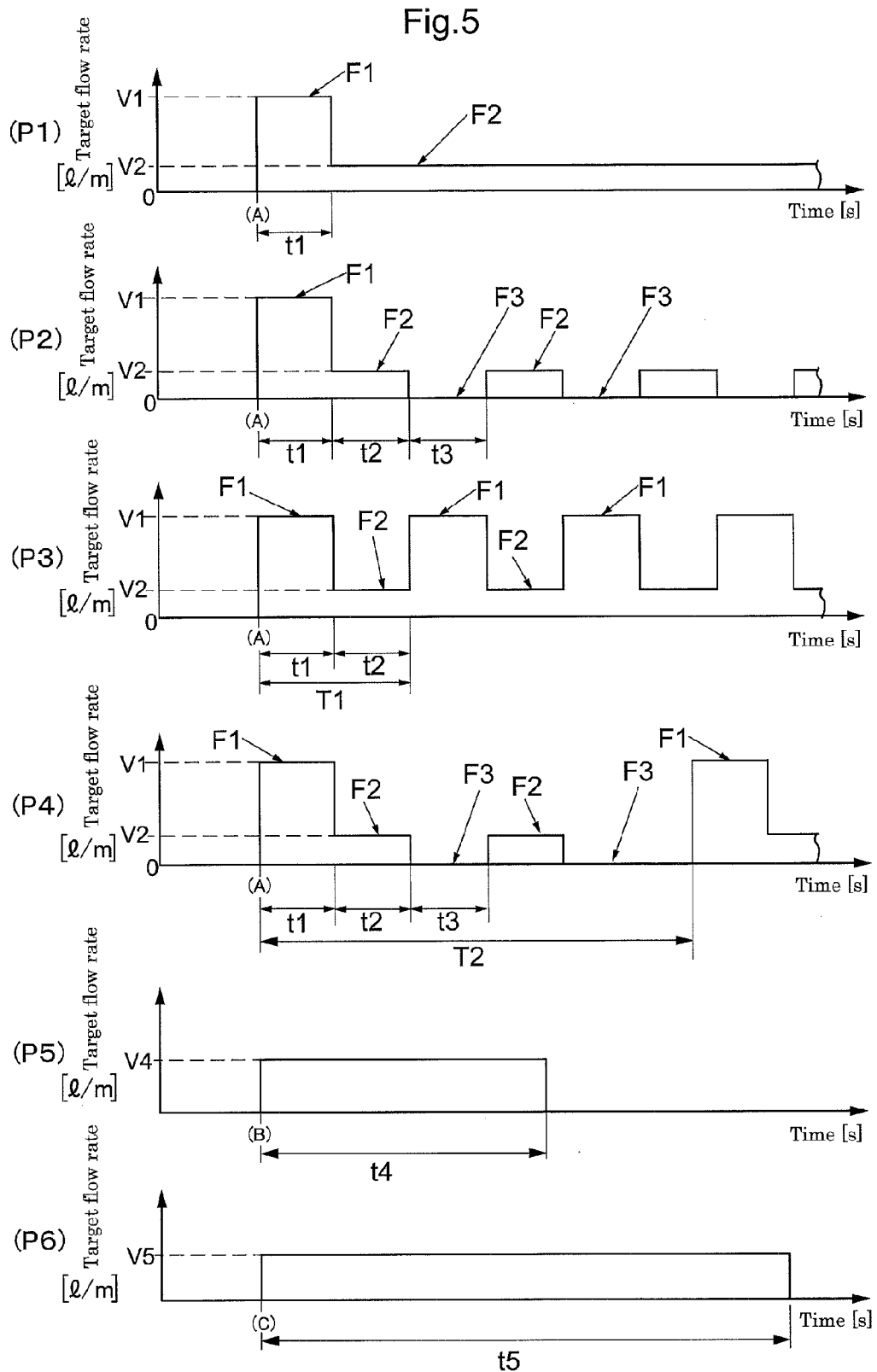
FIG. 5 is a diagram showing inactive gas supply patterns.

When the second mode is selected, the user specifies the supply flow rate of inactive gas for a target storage section 11 in real time. On the other hand, when the first mode is selected, the supply flow rate of inactive gas is automatically controlled based on a supply pattern P which is specified, or defined, by two or more parameters defined in advance. As such supply patterns P, three kinds of supply patterns, namely supply patterns for storage, a supply pattern for nozzle cleaning, and a supply pattern for piping cleaning are provided in the present embodiment. In addition, four mutually distinct supply patterns are provided as the supply patterns P for storage. More specifically, as shown in FIG. 5, a total of six supply patterns P are provided in the present embodiment: four supply patterns P1-P4 for storage, one supply pattern P5 for nozzle cleaning, one supply pattern P6 for piping cleaning.

Supply of the inactive gas in accordance with the four supply patterns P1-P4 for storage is performed when a container 40 is detected by the pair of first sensors S1. In the present embodiment, each of the supply patterns P1-P4 for storage has a plurality of supply phases F that are defined such that the combination of supply timing of inactive gas and a target flow rate V is different for a different supply phase. Each of the supply patterns P1-P4 includes at least a first supply phase F1 in which inactive gas is supplied at a first target flow rate V1 defined in advance, and a second supply phase F2 in which the inactive gas is supplied at a second target flow rate V2 which is less than the first target flow rate V1. The supply patterns P1-P4 may also include a third supply phase F3 in which the supply of inactive gas is stopped or paused (in other words, inactive gas is supplied at a third target flow rate which is set to be zero).

The first supply pattern (the first supply pattern for storage) P1 includes one each of the first supply phase F1 and the second supply phase F2. In the first supply pattern P1, inactive gas is supplied at the first target flow rate V1 for a first set period t1 from a container storage completion time (time (A) shown in FIG. 5), and subsequently, the inactive gas is continuously supplied at the second target flow rate V2. The container storage completion time is the time at which the storage of a container 40 in a storage section 11 is completed. In the present embodiment, the container storage completion time is defined to be the time at which a set period (for example, 2 seconds) has elapsed after the pair of first sensors S1 detected the presence of the container 40.

The second supply pattern (second supply pattern for storage) P2 includes one of the first supply phase F1, and one or more of each of the second supply phase F2 and the third supply phase F3. In the second supply pattern P2, inactive gas is supplied at the first target flow rate V1 for the first set period t1 from the container storage completion time, and subsequently, the inactive gas is supplied intermittently at the second target flow rate V2. That is, in the second supply pattern P2, the supply of inactive gas at the second target flow rate V2 for a second set period t2, and stoppage of the supply of the inactive gas for a third set period t3 is repeated after the first set period t1 elapses.

The third supply pattern (third supply pattern for storage) P3 includes one or more of the first supply phase F1 and the second supply phase F2. The third supply pattern P3 is a pattern in which the first supply pattern P1 described above is repeated at every first cycle T1 defined in advance. That is, in the third supply pattern P3, inactive gas is supplied at the first target flow rate V1 for the first set period t1 from the container storage completion time and subsequently, the inactive gas is supplied at the second target flow rate V2 for the second set period t2. And with this combination taken as the basic pattern, this basic pattern is repeated periodically (i.e., at every T1=t1+t2).

The fourth supply pattern (fourth supply pattern for storage) P4 includes one or more of each of the first supply phase F1, the second supply phase F2, and the third supply phase F3. The fourth supply pattern P4 is a pattern in which the second supply pattern P2 described above is repeated at every second cycle T2 defined in advance. That is, in the fourth supply pattern P4, inactive gas is supplied at the first target flow rate V1 for the first set period t1 from the container storage completion time, after which supply of the inactive gas at the second target flow rate V2 for the second set period t2 followed by stoppage of the supply of the inactive gas for the third set period t3 is repeated. And with this taken as a basic pattern, this basic pattern is repeated periodically (i.e., at every T2=t1+N*(t2+t3) where N is a natural number).

With respect to these supply patterns P1-P4 for storage, the user can make appropriate changes to each parameter (V1, V2, t1, t2, t3, T1, T2) while monitoring, for example, the storage state of the substrates B. And the user can select the optimal supply pattern P defined by the optimal parameters depending on the stored substrates B.

Supply of the inactive gas in accordance with the fifth supply pattern (supply pattern for nozzle cleaning) P5 is performed at the timing at which the container 40 is carried into the conveyor 22. In the fifth supply pattern P5, inactive gas is continuously supplied at a fourth target flow rate V4 for a fourth set period t4 from a container carrying-in time (at time (B) shown in FIG. 5).

Supply of the inactive gas in accordance with the sixth supply pattern (supply pattern for pipe cleaning) P6 is performed at the timing at which a start command is received from the user at the time of installation of the storage rack 10, etc. In the sixth supply pattern P6, inactive gas is continuously supplied at a fifth target flow rate V5 for a fifth set period t5 from the timing of the start command (at time (C) shown in FIG. 5).

Each parameter (V4, V5, t4, t5) in the fifth supply pattern P5 and the sixth supply pattern P6 is set to a reference value in advance. The fourth target flow rate V4 and the fifth target flow rate V5 are set to be less than the first target flow rate V1 in the supply patterns P1-P4 for storage but to be greater than the second target flow rate V2. The fifth target flow rate V5 is set to be less than the fourth target flow rate V4. In addition, the fifth set period t5 is set to be longer than the fourth set period t4.

The following are examples of a typical preset value of each parameter:
  First target flow rate V1: 40-60 [L/min],
  Second target flow rate V2: 1-10 [L/min],
  Fourth target flow rate V4: 25-35 [L/min],
  Fifth target flow rate V5: 15-25 [L/min],
  Fourth set period t4: 1-10 [s], and
  Fifth set period t5: 900-3000 [s].
The first set period t1, the second set period t2, the third set period t3, and the second cycle T2 may be set to any desired values.

The gas supplying portion 30 is configured to supply inactive gas based on one of the first to the fourth supply patterns P1-P4 with the container 40 stored in a storage section 11, in order to create an inactive atmosphere suitable for storing the substrates B in the container 40. In addition, the gas supplying portion 30 is configured to supply inactive gas in the predetermined period (pre-storage supply period) based on the fifth supply pattern P5 before the container 40 is stored in the storage section 11 by the transport portion 20, to clean the gas supply nozzle 15. In addition, the gas supplying portion 30 is configured to supply inactive gas based on the sixth supply pattern P6 in the predetermined period (post-installation sup-ply period) after the installation of the storage rack 10, to clean the piping from the inactive gas supply source to the gas supply nozzle 15.

As shown in FIG. 4, the managing calculating device 50 is provided to the control panel Hs provided to the controller H. The managing calculating device 50 includes, as a core component, a calculating operation portion, such as a CPU. And a plurality of functional portions for performing various operations to the inputted data are defined by hardware, or software (one or more computer programs), or both.

Figure 6:
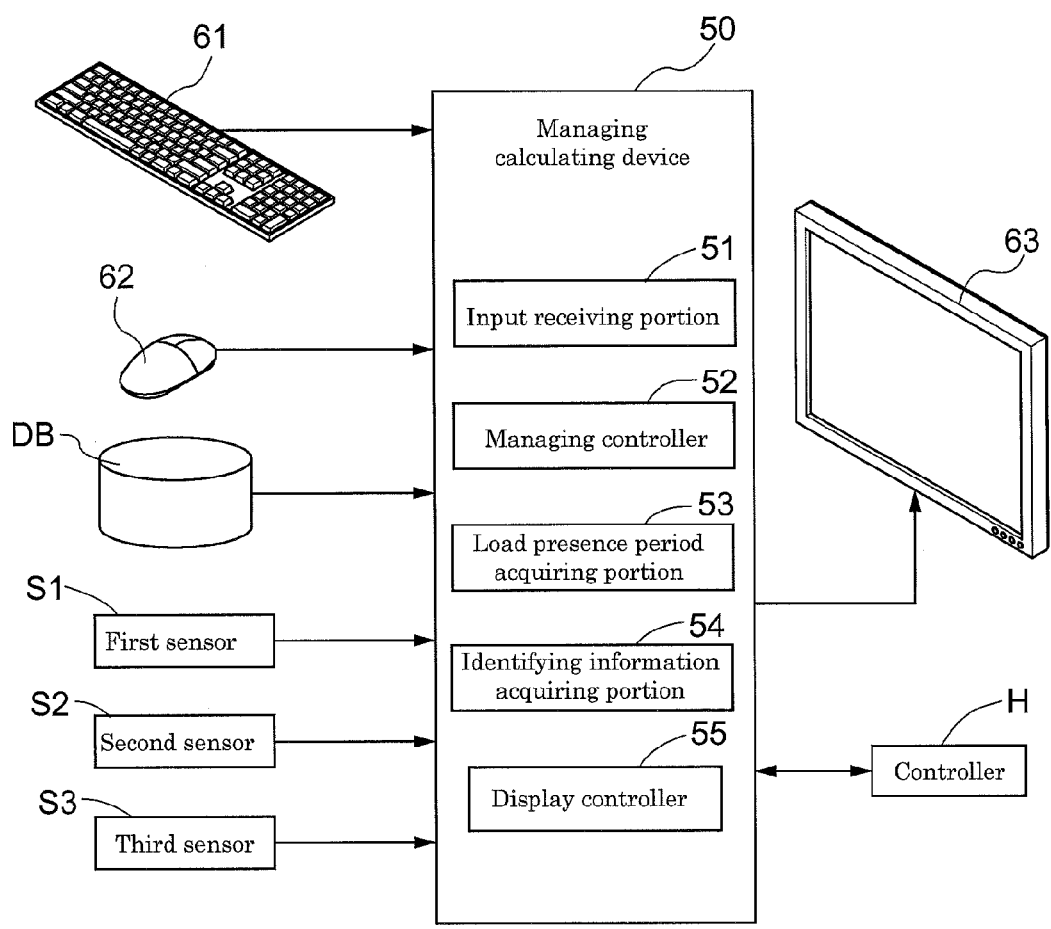
FIG. 6 is a block diagram showing the structure of the managing calculating device.

As shown in FIG. 6, the managing calculating device 50 includes an input receiving portion 51, a managing controller 52, a load presence period acquiring portion 53, an identifying information acquiring portion 54, and a display controller 55. In addition, the managing calculating device 50 is connected to a keyboard 61, a pointing device 62, a display 63, and a data base DB. In addition, the managing calculating device 50 is configured to be able to acquire information on the detection result from the first sensor S1, the second sensor S2, and the third sensor S3. In addition, in present embodiment, each step of the article storage method in accordance with the present invention is performed by collaboration between the managing calculating device 50 and the display 63.

As described above, the first sensor (load presence sensor) S1 is provided to the support portion 12, and detects the presence of the container 40 in the storage section 11. The second sensor S2 is installed at a prescribed position in the transporting path from the transport vehicle 21 to the stacker crane 24, and detects identifying information, such as ID (container ID) provided to the container 40. The second sensor S2 may be, for example, a tag reader etc., which reads in information stored by an IC tag located at a prescribed position on the container 40. Alternatively, the second sensor S2 may be, for example, a bar code reader etc., which reads a bar code (which may include a one-dimensional bar code or a two-dimensional bar code). In this sense, the second sensor S2 can also be called a "reading sensor". The third sensor S3 is installed at a prescribed position in the gas supplying portion 30, and detects the actual supply flow rate of inactive gas. The third sensor S3 may be the flow rate sensor provided in the mass flow controller 32 described above.

The keyboard 61 is, for example, a common keyboard, such as one with the JIS standard arrangement, and is used to input characters, and numbers, etc. The pointing device 62 is a mouse, or a track pad, etc., for example, and is used to input coordinate positions, and a predetermined operation, etc. The display 63 is such display as a CRT or a liquid crystal display, and displays various kinds of images, and characters, etc. on its display screen. A display 63 that incorporates a touch panel may be used, in which case, at least one of the keyboard 61 and the pointing device 62 may be omitted. The information on the arrangement (layout) of the plurality of storage sections 11 which depends on the various specifications of the storage rack 10 is arranged in a database form and stored in the data base DB.

The input receiving portion 51 receives input from the keyboard 61 and the pointing device 62 (or a display 63 with a touch-panel function in some cases).

The managing controller 52 manages the supply state of inactive gas from the gas supplying portion 30. The managing controller 52 manages, for example, the supply mode of inactive gas, and additionally manages the supply pattern P of inactive gas when the first mode (automatic supply mode) is selected. In addition, the managing controller 52 additionally manages each parameter (V1, V2, t1, t2, t3, T1, T2) when the supply pattern P1-P4 for storage is selected. The managing controller 52 manages the supply mode, the supply pattern P, and each parameter based on user's specification inputted through the keyboard 61 and pointing device 62, etc. These pieces of information are transmitted to the controller H and the purge controller Hp. And the supply of inactive gas from the gas supplying portion 30 is controlled based on the information. The managing controller 52 manages the supply state as described above for each of the plurality of storage sections 11 (i.e., the plurality of containers 40).

In addition, when the supply patterns P1-P4 for storage is selected, the managing controller 52 is configured to be able to acquire information on, or related to, the supply phase F at the time from the purge controllers Hp. In the present embodiment, the managing controller 52 transmits to the display controller 55 the information that is related to the supply phase F of inactive gas being supplied to each container 40 and that is acquired from the purge controller Hp. The managing controller 52 also transmits to the display controller 55 the information related to the supply pattern P of inactive gas being supplied to each container 40.

The load presence period acquiring portion 53 acquires a load presence period which is the amount of time that has elapsed since the container 40 was stored in the storage section 11. The load presence period acquiring portion 53 acquires the load presence period based on information on the detection result from the first sensors S1. The load presence period acquiring portion 53 detects the time at which the container 40 is stored in the storage section 11, for example, by the first sensors S1, and acquires, or obtains, the load presence period by means of a count-up timer which defines the container storage completion time to be the starting point.

The identifying information acquiring portion 54 acquires identifying information (container ID) of each of the containers 40 stored in the storage sections 11. The identifying information acquiring portion 54 acquires, or obtains, the container ID based on information on the detection result from the second sensor S2.

The information on the load presence period acquired by the load presence period acquiring portion 53 and the information on the container ID acquired by the identifying information acquiring portion 54 are transmitted to the managing controller 52. The managing controller 52 also manages a storage period of each container 40 as well as a supply history (purge history) of inactive gas supplied to each stored container 40 based on these pieces of information. The managing controller 52 determines whether, for example, the load presence period for each container 40 is less than or equal to a standard load presence period (for example, one week) defined in advance, and makes a determination as to if the storage period of a given container 40 is appropriate. In addition, the managing controller 52 determines whether the container ID has been successfully acquired, for example, by the identifying information acquiring portion 54 (the second sensor S2), and makes a determination as to if it is possible to properly manage the purge history of a given container 40 to be stored. The managing controller 52 transmits information on these determination results to the display controller 55.

The display controller 55 controls image creation of the display image (including text) shown on the screen of the display 63. The display controller 55 controls image creation of the menu image for receiving various commands for the control application for the article storage facility 1, for example, in a first display area A1 (see FIG. 7) defined on the screen of the display 63. In addition, the display controller 55 controls creation of images that indicate the operation states (operational status, gas pressure, oxygen concentration, load presence status, etc.) of the entire system of the article storage facility 1, the operation states including the operation state of the transport portion 20 and the operation states of the gas supplying portions 30, for example, in a second display area A2. In addition, the display controller 55 controls creation of images that indicate the state of each container 40 stored in the plurality of storage sections 11 of the storage rack 10, for example, in a third display area A3. In addition, the display controller 55 controls creation of an image of a pointer (cursor) at the position on the screen which the pointing device 62 points to. The display controller 55 may control creation of an image that indicates in more detail the load presence status for each storage rack 10, etc. in other display area (a fourth display area) defined on the screen of the display 63.

Figure 7:
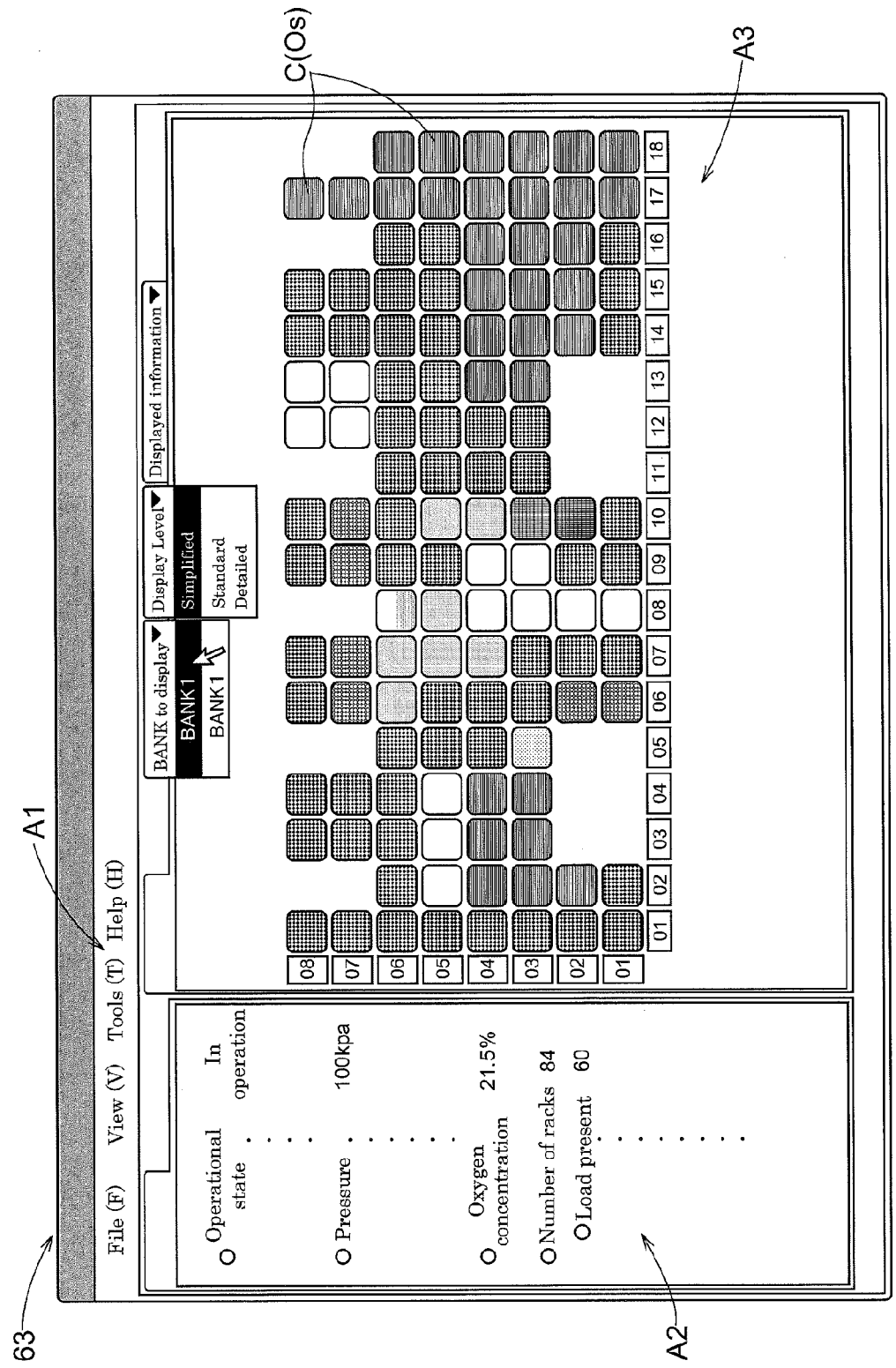
FIG. 7 is a diagram showing images displayed on a display.

The images showing the state of each container 40 displayed in the third display area A3 are described next with reference to FIG. 7 which shows a situation actually displayed. Here, it is assumed that the first mode (automatic supply mode) is selected. In the present invention, a plurality of display sections C are displayed in the third display area A3 such that the displayed sections correspond to the arrangement (arrangement in the vertical and horizontal directions) of the plurality of storage sections 11 in the storage rack 10. Each display section C is rectangular in shape (square in the present example). These display sections C are arranged such that the display sections C are next to one another in the vertical direction while at each vertical position, the display sections C are arranged next to one another in the lateral, or horizontal, direction. In some cases, a storage section 11 may not be provided in a specific position. In such cases, no display section C is displayed at the corresponding position on the screen.

Displayed in each of the plurality of display sections C is the supply state (referred to hereinafter as the "gas supply state") of inactive gas supplied to the container 40 stored in the corresponding storage section 11. In the present embodiment, the gas supply states are displayed as state representing objects Os which symbolize a plurality of states in a visually identifiable manner. In addition, in the present embodiment, the entirety of each display section C is a state representing object Os.

In the first mode (automatic supply mode), as described above, the gas supply state of the inactive gas from the gas supplying portion 30 is managed based on the plurality of supply patterns P. In addition, when a supply pattern P1-P4 for storage is selected, each further includes a plurality of supply phases F. In the present embodiment, each supply phase F in the supply patterns P1-P4 for storage and the supply patterns P5 and P6 other than those for storage are displayed in a visually identifiable manner as mutually different gas supply states. More specifically, they are displayed such that corresponding state representing objects Os are displayed in mutually different colors (also see FIG. 8).

For example, when a supply pattern P1-P4 for storage is selected for the container 40 stored in each storage section 11, the supply phase F at the time is indicated (as one kind of gas supply state for the container 40) with a different color depending on the supply phase F. In addition, when the fifth supply pattern P5 for nozzle cleaning is selected, the fact that the gas supply is being performed for cleaning the gas supply nozzle 15 is indicated (as one kind of gas supply state for the container 40) with a color even different from those colors representing respective ones of the plurality of supply phases F. Further, when the sixth supply pattern P6 for piping cleaning is selected, the fact that the gas supply is being performed for cleaning the entirety of the piping is indicated (as one kind of gas supply state for the container 40) with a color even different from those colors representing the plurality of supply phases F and the nozzle cleaning.

In the present embodiment, the fact that no container 40 is stored in any given storage section 11, or that inactive gas is not supplied is indicated with a color even different from the colors described above, as a kind of a gas supply state. In addition, in the present embodiment, when a negative determination result is obtained concerning the properness of the storage period of a specific container 40 or the properness of purge history management of the container 40 to be stored, these facts are also indicated with colors even different from those described above. In such cases, the state representing objects Os indicated with the colors which shows those facts can also be considered to be a kind of "warning information", indicating a storage period beyond the standard load presence period and unsuccessful acquisition of container ID. Furthermore, in the present embodiment, when supply of the inactive gas to a specific storage section 11 is performed at an actual flow rate that is insufficient for the given target flow rate V, or when the gas supply is forcibly stopped by the user, these facts are also indicated with colors even different from those described above.

Thus, in the present embodiment, the gas supply state for the container 40 stored in each storage section 11 is indicated by the state representing objects Os of mutually different colors depending on the supply pattern P, the supply phase F, and various kinds of improper states. In addition, these state representing objects Os are displayed in the third display area A3 such that these state representing objects Os are arranged to correspond to the arrangement of the plurality of storage sections 11 in the storage rack 10. Therefore, it is easy for the user to intuitively grasp the gas supply state for each container 40 stored in each position (storage section 11) of the actual storage rack 10. Accordingly, the user can easily and properly perform storage management of the substrates B.

In the present embodiment, a purge progress is further displayed as a kind of a gas supply state for the containers 40 that satisfy a specific condition among the containers 40 subjected to the first supply phase F1. The purge progress is the proportion of the amount of the inactive gas that has been supplied to the container 40 with respect to the internal volume of the container 40. And the purge progress is roughly or approximately equal to the proportion of the amount of the existing gas in the container 40 that is replaced by the newly supplied inactive gas. An example of a specific condition is that the container 40 is newly stored in the storage section 11 by the transport portion 20. That is, in one preferable embodiment of the present invention, when a new container 40 is stored in a storage section 11, the purge progress is displayed for the newly stored container 40. In other words, the purge progress is displayed only for the initial (i.e., first time) first supply phase F1 for each container 40.

Figures 8, 9:
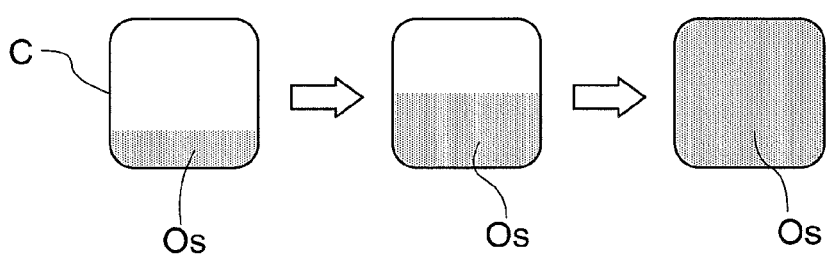
FIG. 8 is a chart for illustrating each state representing object.
FIG. 9 is an explanatory drawing showing a progress of a purging process.

As shown in FIG. 9, in the present embodiment, the purge progress is expressed by making the state representing object Os corresponding to the first supply phase F1 a dynamic object. That is, the purge progress is expressed by the state representing object Os whose area (or the length of two lateral sides (or top and bottom sides) that face each other) increases gradually over time. The state representing object Os changes from a state in which its area or the length of its sides at the starting time (container storage completion time) of the first supply phase F1 is zero to a state in which its area or the length of its sides at the completion time (at the end of the first set period t1) of the first supply phase F1 is at its maximum.

In one embodiment, the state representing object Os preferably changes continuously such that the proportion of its area or the length of its sides at any one time with respect to its maximum is equal to the purge progress. Alternatively, the state representing object Os may change in incremental steps such that the proportion of its area or the length of its sides at any one time with respect to the maximum is roughly or approximately equal to the purge progress. By adapting such an arrangement, the user can easily grasp intuitively the proportion of the amount of the gas previously contained in the container 40, such as air and vapor, that is replaced by inactive gas. In addition, a rough estimate of the remaining time to the completion of the purging process by the inactive gas can be perceived easily.

In the present embodiment, the gas supply state for the storage section 11 (container 40) corresponding to each display section C is displayed for only one of the pair of storage racks 10 (banks) at any one moment. And the storage rack 10 being displayed can be changed based on a manual operation. By specifying the desired storage rack 10 by means of a rack selection pull down menu (see FIG. 7) displayed in an upper portion in the third display area A3, the user can cause the gas supply state for each storage section 11 (container 40) in the desired storage rack 10 to be displayed.

A level selection pull down menu is displayed in the upper portion in the third display area A3 and next to the rack selection pull-down menu. By specifying a desired display level by means of the level selection pull down menu, the user can cause various kinds of information to be displayed with the corresponding degree of detail. The example of the display described in the present embodiment is at the "simplified level", in which useful information for the user (gas supply state for each container 40) can be provided in a very simple and easily recognizable manner.

2. Second Embodiment

The second embodiment of an article storage facility in accordance with the present invention is described next with reference to the drawings. In the present embodiment, the degree of detail with which the information displayed in the third display area A3 differs from that in the first embodiment described above. The other elements are identical to those in the first embodiment described above. The display in the present embodiment is at the "standard level" with a greater degree of detail than the "simplified level" described in the first embodiment above.

Figure 10:
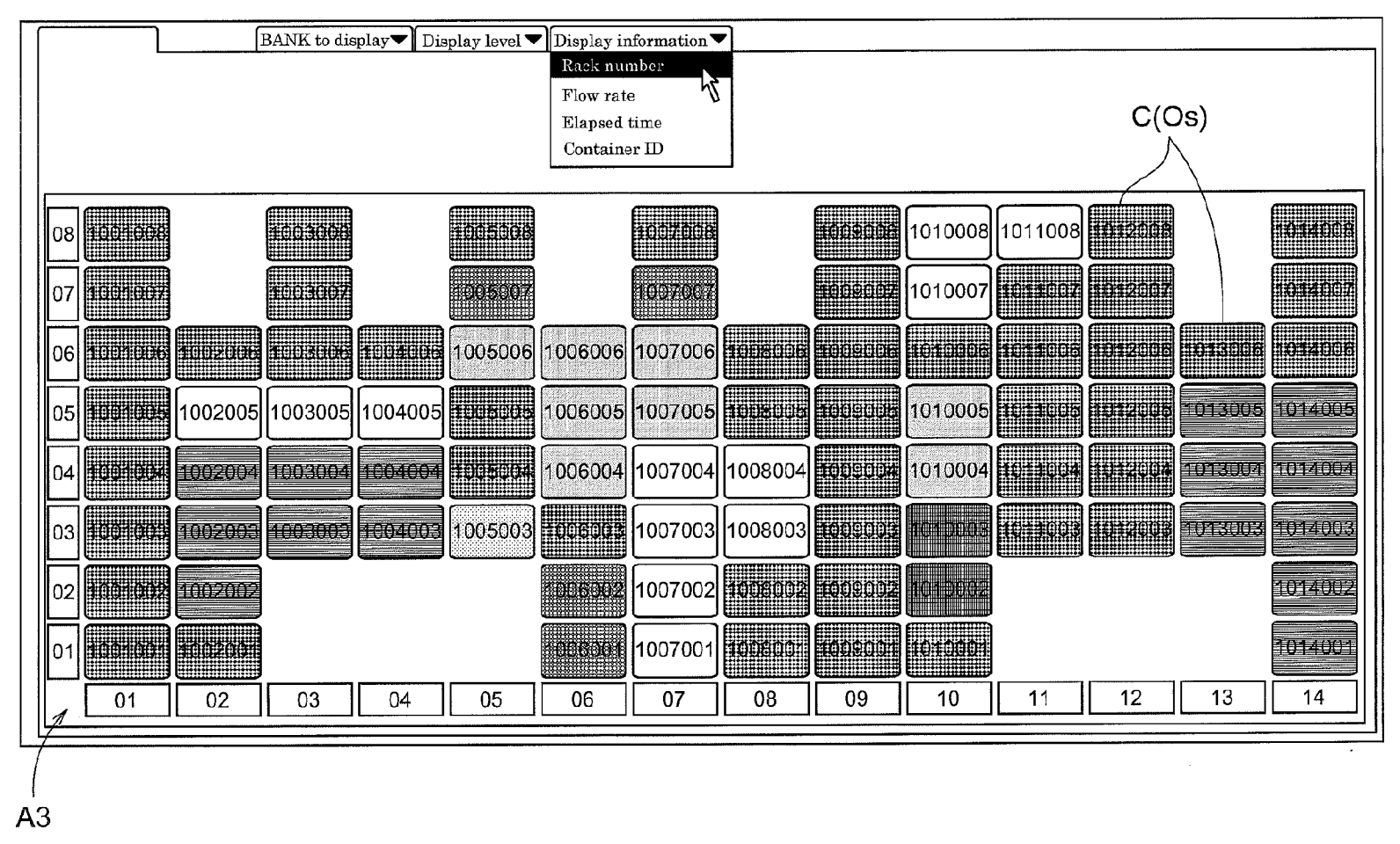

As shown in FIG. 10, each display section C is rectangular in shape (a rectangle in the present example). And the entirety of each display section C is a state representing object Os which indicates the gas supply state for each storage section 11 (container 40). In the present embodiment, information about the control status of the system (management information) is displayed and superimposed on the state representing object Os. Examples of the management information include, for example, a rack number (identification number of each storage section 11 in the storage rack 10), flow rate of inactive gas, elapsed time since storage, a container ID of the container 40 stored in each storage section 11. By specifying the desired management information by means of the information selection pull down menu displayed in the upper portion in the third display area A3, the user can cause the desired management information to be displayed in correspondence with each storage section 11 (container 40). With the arrangement in the present embodiment, useful information for the user (gas supply state and various management information for each container 40) can be provided in a very simple and easily recognizable manner.

3. Third Embodiment

The third embodiment of an article storage facility in accordance with the present invention is described next with reference to the drawings. In the present embodiment, the degree of detail with which the information displayed in the third display area A3 differs from those in the first and second embodiments described above. The other elements are identical to those in the first and second embodiments described above. The display in the present embodiment is at the "detailed level" with even a greater degree of detail than the "standard level" described in the second embodiment above.

Figure 11:
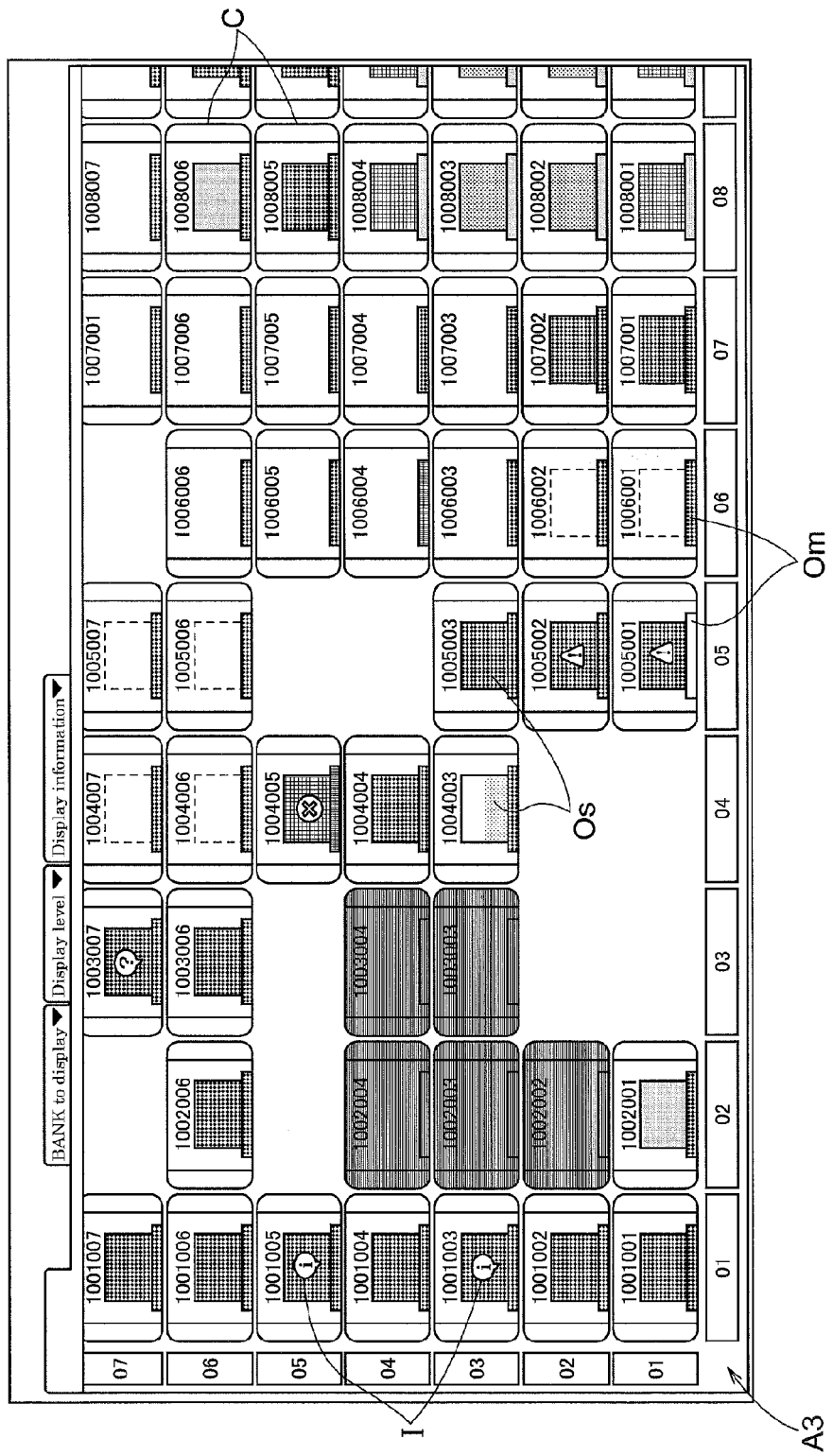
FIG. 11 is another diagram showing the images displayed on the display.

As shown in FIG. 11, each display section C is rectangular in shape (a rectangle in the present example). In the present embodiment, the state representing object Os which indicates the gas supply state for each storage section 11 (container 40) is displayed such that it occupies a part of each display section C. More specifically, as shown in an expanded view in FIG. 12, the state representing object Os is located in a central portion of the display section C, and is displayed in the central area with the similarity ratio of about 1:2 with respect to the entire display section C. The manner in which this state representing object Os is displayed is identical to that in the first embodiment above apart from the fact that the state representing object Os cannot be used to indicate warning and abnormality.

In the present embodiment, the supply mode of inactive gas is further displayed as one kind of the gas supply state, in addition to the supply pattern P and the supply phase F, etc. More specifically, each display section C further displays a mode representing object Om that indicates the supply mode for the inactive gas supplied to the corresponding container 40 in addition to the state representing object Os. The mode representing object Om is displayed in a downward area below and next to the central area. This downward area is arranged to extend along the lower edge of the display section C. Thus, the mode representing object Om is displayed in an area below and next to the state representing object Os, and along the lower edge of the display section C.

In the present embodiment, either the first mode (automatic supply mode) or the second mode (manual supply mode) is visually displayed in an identifiable manner as a mutually different gas supply state. More specifically, these first and second modes are displayed with a mode representing object Om in different colors corresponding to respective modes. In addition, in the present embodiment, the fact that the supply of inactive gas is stopped is also displayed with a color that is different from those colors representing the plurality of supply modes. Further, when supply of the inactive gas to a specific storage section 11 is performed at an actual flow rate that is insufficient for the given target flow rate V, or when the gas supply is forcibly stopped by the user, these facts are also indicated with colors even different from those described above as warning and abnormality.

In the present embodiment, information about the control status of the system (management information) is further displayed in addition to, and independently from, the gas supply state. These pieces of management information are displayed in an upper area above and next to the central area. This upper area is arranged to extend along the top side of the display section C. Thus, the management information is displayed in an area above and next to the state representing object Os, and along the top side of the display section C. The manner in which the management information is displayed and its contents are identical to those in the second embodiment described above except that the information is not superimposed on the state representing object Os.

Figure 12:
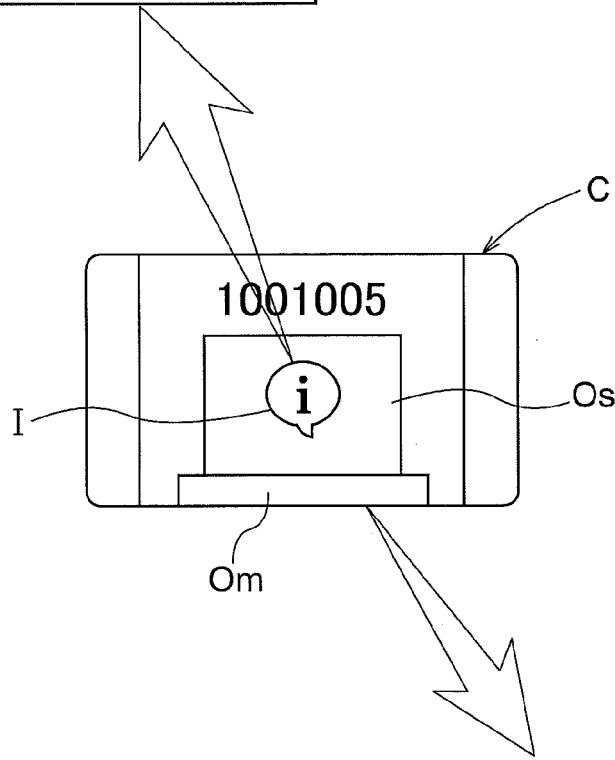
FIG. 12 is an explanatory drawing showing how the display section is structured.

In the present embodiment, when it is determined that the storage period of the specific container 40 is improper and that the purge history management of the container 40 being stored is improper, warning information which indicates these facts is displayed independently from the gas supply state. In addition, in the present embodiment, when supply of the inactive gas to a specific storage section 11 is performed at an actual flow rate that is insufficient for the given target flow rate V, or when the gas supply is forcibly stopped by the user, warning information which indicates these facts is also displayed. In the present embodiment, warning information is displayed in the form of an icon I with a design. The icon I is superimposed on the state representing object Os and displayed in the central portion of the display section C. In addition, in the present embodiment, the design of the icon I is different depending on the kind of the warning. FIG. 12 shows examples of the icons I with mutually different designs which respectively represent that the standard load presence period has been exceeded, that the container ID has not been obtained, that the actual flow rate is insufficient, and that the supply has been forcibly stopped.

As such, in the present embodiment, the gas supply state for the container 40 stored in each storage section 11 is indicated by a combination of the state representing objects Os of mutually different colors and the mode representing object Om of mutually different colors depending on the supply pattern P, the supply phase F and the supply mode. Further, when various kinds of improper states exist, that fact is notified by means of icons I of mutually different designs. These state representing objects Os, the mode representing objects Om, and the icons I are collectively displayed in the display sections C which are arranged to correspond to the arrangement of the plurality of storage sections 11 in the storage rack 10. Accordingly, the user can obtain various kinds of useful information (information, including gas supply state, supply mode, and various warnings, etc.) easily and in detail, for each location (storage section 11) of the actual storage rack 10.

4. Other Embodiments

Finally, other embodiments of the article storage facility in accordance with the present invention are described. It is to be understood that arrangements disclosed in each of the following embodiments may be applied in combination with the arrangements disclosed in other embodiments in the absence of any inconsistency.

(1) In each of the embodiments described above, an example is described in which the purge progress is expressed by a dynamic state representing object Os. However, embodiments of the present invention are not limited to this arrangement. For example, an object that represents the purge progress (progress representing object) may be displayed separately from the state representing object Os. Alternatively, the purge progress may be displayed by means of a text (for example, numerical value denoted by percentage). In this case, the object or text indicating the purge progress may be superimposed and displayed, for example, on the state representing object Os.

(2) In each of the embodiments described above, an example is described in which the purge progress is displayed only for the initial first supply phase F1 for each storage section 11 (each container 40). However, embodiments of the present invention are not limited to this arrangement. For example, when a supply pattern P that includes a plurality of first supply phases F1 is used, the purge progress may also be displayed for the first supply phases F1 that come after the initial first supply phase F1. Also, the identical state representing object Os may be displayed for the storage sections 11 (containers 40) in the first supply phase F1 without displaying the purge progress. Alternatively, the display of the progress does not have to be limited to the first supply phase F1. And for other phase having a limited period (e.g., the second supply phase F2), the progress during the period may be displayed.

(3) In each of the embodiments described above, an example is described in which depending on the supply pattern P, the supply phase F, and various kinds of improper states, they are indicated by state representing objects Os of mutually different colors. However, embodiments of the present invention are not limited to this arrangement. For example, the colors of the state representing objects Os may be defined such that they differ depending only on the supply pattern P and the supply phase F. Also, the colors of the state representing objects Os may be defined such that they differ depending only on the supply phase F in the supply patterns P1-P4 for management.

(4) Each of the embodiments described above is described by illustrating examples of six supply patterns P. However, these are illustrated only as examples, and the embodiments of the present invention are not limited to this arrangement. The quantities specified by the parameters and/or the number of the parameters or that define the supply patterns P may be defined as desired. And other supply patterns having different profiles from those described above may be used to supply inactive gas.

(5) In each of the embodiments described above, an example is described in which the supply modes, the supply patterns P, the supply phases F, and warnings, etc. are displayed as graphical representations (designs) by means of the state representing objects Os, the mode representing objects Om, or the icons I. However, embodiments of the present invention are not limited to this arrangement. For example, one or more of the supply mode, the supply pattern P, the supply phase F, and the warning may be displayed as text.

(6) In addition, with regard to other arrangements and elements, the embodiments disclosed in the present specification are examples with respect to all described elements. And it is to be understood that the scope of the present invention is not limited by these examples. A person skilled in the art will be able to appreciate easily that suitable changes and modifications may be made without departing from the spirit of the present invention. Accordingly, any other embodiments with any changes and modifications made without departing from the spirit of the present invention would naturally fall within the scope of the invention.

INDUSTRIAL APPLICABILITY

The present invention can be utilized in an article storage facility and article storage method, for storing articles.

What is claimed is:

1. An article storage facility comprising:
    a storage rack having a plurality of storage sections arranged with regularity;
    a transport portion which carries in airtight containers to the storage sections and carries out the airtight containers from the storage sections;
    gas supplying portions which supply inactive gas to respective ones of the containers stored in the storage sections, in accordance with a supply pattern defined in advance;
    a display which displays an operation state of a system of the article storage facility, the operation state including an operation state of the transport portion and operation states of the gas supplying portions;
    wherein the display displays a plurality of display sections such that an arrangement of the display sections corresponds to an arrangement of the plurality of the storage sections in the storage rack, and also displays, in each of the plurality of display sections, a supply state of the inactive gas to the container stored in a corresponding one of the storage sections.

2. The article storage facility as defined in claim 1, wherein the display displays, as a kind of the gas supply state, purge progress which represents a proportion of the amount of the inactive gas that has been supplied to the container with respect to an internal volume of the container.

3. The article storage facility as defined in claim 2, wherein when the container is carried into the storage section by the transport portion, the display displays the purge progress for the container.

4. The article storage facility as defined in claim 1, wherein the supply pattern includes a plurality of supply phases that are defined such that a combination of a supplying timing of the inactive gas and a target flow rate is different for a different supply phase, and
    wherein the display indicates, as a kind of the supply state, which one of the supply phases the container is subjected to at the time by means of different colors depending on the supply phase.

5. The article storage facility as defined in claim 4, wherein the gas supplying portion is configured to be able to supply the inactive gas to clean a gas supply nozzle which fits into a gas supply opening provided to the container, in a predetermined period before the container is carried into the storage section by the transport portion, and
    wherein the display indicates, as a kind of the supply state, the fact that the inactive gas is being supplied to clean the gas supply nozzle by means of a color that is different from the colors representing respective ones of the plurality of supply phases.

6. The article storage facility as defined in claim 1, further comprising:
    a load presence period acquiring portion which acquires a load presence period which is an elapsed time after the container is carried into the storage section,
    wherein, if the load presence period for a given container exceeds a standard load presence period defined in advance, the display further displays warning information indicating that the standard load presence period has been exceeded, in the display section corresponding to the storage section in which the container is stored.

7. The article storage facility as defined in claim 1, further comprising:
    an identifying information acquiring portion which acquires identifying information of the containers stored in the storage sections,
    wherein, if the identifying information acquiring portion is unable to acquire identifying information for a given container, the display further displays warning information indicating that the identifying information is not acquired, in the display section corresponding to the storage section in which the container is stored.

8. An article storage method utilizing an article storage facility,
    the article storage facility including
    a storage rack having a plurality of storage sections arranged with regularity;
    a transport portion which carries in airtight containers to the storage sections and carries out the airtight containers from the storage sections;
    gas supplying portions which supply inactive gas to respective ones of the containers stored in the storage sections, in accordance with a supply pattern defined in advance;

a display which displays an operation state of a system of the article storage facility, the operation state including an operation state of the transport portion and operation states of the gas supplying portions;

the article storage method comprising the following step that is performed by the display:

a supply state displaying step of displaying a plurality of display sections such that an arrangement of the display sections corresponds to an arrangement of the plurality of the storage sections in the storage rack, and also displaying, in each of the plurality of display sections, a supply state of the inactive gas to the container stored in a corresponding one of the storage sections.

9. The article storage method as defined in claim 8, wherein
in the supply state displaying step, as a kind of the gas supply state, purge progress is displayed, the purge progress representing a proportion of the amount of the inactive gas that has been supplied to the container with respect to an internal volume of the container.

10. The article storage method as defined in claim 9, wherein
in the supply state displaying step, when the container is carried into the storage section by the transport portion, the purge progress for the container is displayed.

11. The article storage method as defined in claim 8, wherein
the supply pattern includes a plurality of supply phases that are defined such that a combination of a supplying timing of the inactive gas and a target flow rate is different for a different supply phase,
wherein, in the supply state displaying step, the supply phase that the container is subjected to at the time is indicated, as a kind of the supply state, by means of different colors depending on the supply phase.

12. The article storage method as defined in claim 11, wherein
the gas supplying portion is configured to be able to supply the inactive gas to clean a gas supply nozzle which fits into a gas supply opening provided to the container, in a predetermined period before the container is carried into the storage section by the transport portion,
wherein, in the supply state displaying step, the fact that the inactive gas is being supplied to clean the gas supply nozzle is indicated, as a kind of the supply state, by means of a color that is different from the colors representing respective ones of the plurality of supply phases.

13. The article storage method as defined in claim 8, wherein
the article storage facility further includes a load presence period acquiring portion which acquires a load presence period which is an elapsed time after the container is carried into the storage section,
and the steps performed by the display further comprising the following step:
a step of further displaying warning information indicating that a standard load presence period has been exceeded, in the display section corresponding to the storage section in which the container is stored, if the load presence period for a given container exceeds the standard load presence period defined in advance.

14. The article storage method as defined in claim 8, wherein
the article storage facility further includes an identifying information acquiring portion which acquires identifying information of the containers stored in the storage sections,
and the steps performed by the display further comprising the following step:
a step of further displaying warning information indicating that the identifying information is not acquired, in the display section corresponding to the storage section in which the container is stored, if the identifying information acquiring portion is unable to acquire identifying information for a given container.

* * * * *